(12) United States Patent
Ulrich

(10) Patent No.: US 6,821,375 B2
(45) Date of Patent: Nov. 23, 2004

(54) METHOD AND APPARATUS FOR MOUNTING SEMICONDUCTOR CHIPS ONTO A FLEXIBLE SUBSTRATE

(75) Inventor: René Josef Ulrich, Weggis (CH)

(73) Assignee: ESEC Trading SA, Cham (CH)

( * ) Notice: Subject to any disclaimer, the term of this patent is extended or adjusted under 35 U.S.C. 154(b) by 365 days.

(21) Appl. No.: 09/896,675

(22) Filed: Jul. 2, 2001

(65) Prior Publication Data
US 2002/0000294 A1 Jan. 3, 2002

(30) Foreign Application Priority Data
Jul. 3, 2000 (CH) .................................... 2000 1308/00

(51) Int. Cl.⁷ .............................................. B29C 65/00
(52) U.S. Cl. ........................ 156/285; 156/297; 156/299
(58) Field of Search ................................ 156/285, 297, 156/299, 307.1; 269/21, 55, 56

(56) References Cited

U.S. PATENT DOCUMENTS

| 4,615,093 A | 10/1986 | Tews et al. .................... 29/407 |
| 4,653,664 A | 3/1987 | Hineno et al. .................. 221/3 |
| 4,810,154 A | 3/1989 | Klemmer et al. ........... 414/222 |
| 4,819,326 A | 4/1989 | Stannek ........................ 29/837 |
| 4,915,770 A | 4/1990 | Haeda et al. ................. 156/344 |
| 4,937,511 A | 6/1990 | Herndon et al. ........ 315/568.21 |
| 4,943,342 A | 7/1990 | Golemon ..................... 156/584 |
| 5,084,959 A | 2/1992 | Ando et al. .................... 29/740 |
| 5,157,734 A | 10/1992 | Chen et al. ..................... 382/8 |
| 5,173,766 A | 12/1992 | Long et al. .................. 257/687 |
| 5,641,114 A * | 6/1997 | Horton et al. .............. 228/222 |
| 6,045,655 A | 4/2000 | DiStefano et al. ........ 156/324.4 |
| 6,149,047 A * | 11/2000 | Oda ............................ 288/6.2 |
| 6,444,492 B1 * | 9/2002 | Ohta ........................... 438/108 |
| 6,517,662 B2 * | 2/2003 | Culnane et al. ............. 156/285 |
| 6,544,377 B1 * | 4/2003 | Minamitani et al. ........ 156/299 |
| 6,621,157 B1 * | 9/2003 | Wirz et al. .................. 257/692 |

FOREIGN PATENT DOCUMENTS

EP 0 236 225 9/1987

\* cited by examiner

Primary Examiner—Blaine Copenheaver
Assistant Examiner—John T. Haran
(74) Attorney, Agent, or Firm—Thelen Reid & Priest LLP; David B. Ritchie

(57) ABSTRACT

The mounting of semiconductor chips onto a flexible substrate takes place in three steps: Firstly, at a dispensing station, adhesive is applied to predetermined substrate sites on the substrate. Then, at a bonding station, semiconductor chips are placed onto the substrate sites. Finally, curing of the adhesive takes place. In accordance with the invention, the substrate is fixed onto a level support surface by means of vacuum during the hardening of the adhesive.

20 Claims, 3 Drawing Sheets

METHOD AND APPARATUS FOR MOUNTING SEMICONDUCTOR CHIPS ONTO A FLEXIBLE SUBSTRATE

PRIORITY CLAIM

The present application claims priority under 35 U.S.C. § 119 based upon Swiss Application No. 2000 1308/00, filed on Jul. 3, 2000.

FIELD OF THE INVENTION

The present invention relates to mounting of semiconductor chips. More particularly, the present invention relates to a method and an apparatus for mounting semiconductor chips onto a flexible substrate.

BACKGROUND OF THE INVENTION

In the semiconductor industry, apart from the proven metallic substrates, flexible substrates such as BGA® flex-tapes are increasingly being used. Furthermore, such flex-tapes are becoming increasingly thin and reach thicknesses of only 50 $\mu$m. This leads to difficulties with the mounting of semiconductor chips which are manifested by irregular thickness of the adhesive between the semiconductor chip and the flextape, inclined (tilt) and incorrect position of the semiconductor chip. In addition, it can happen that, before finally hardening, the adhesive flows about, contracts, separates locally in various phases, etc., which can strongly impair the quality of the adhesive bond. Contamination of the bond pads can also result from this.

The object of the invention is to propose a method and a device with which flexible substrates can be equipped with semiconductor chips in reliable and high quality.

BRIEF DESCRIPTION OF THE INVENTION

Solving of the task is achieved in accordance with an embodiment of the invention in that the substrate is held flat on a level support surface at least during hardening of the adhesive preferably however during all critical phases of the mounting process.

With a first solution, the automatic assembly machine, a so-called die bonder, is equipped with a heating plate in order to harden the adhesive immediately after applying the semiconductor chip. The heating plate has channels or grooves on the support surface facing the substrate to which vacuum can be applied in order to hold the substrate flat until the adhesive has hardened. In addition, the automatic assembly machine is preferably equipped with a support plate which also has channels or grooves to which vacuum can be applied in order to suck the entire area of the substrate onto a level support surface during application of the adhesive and during placement of the semiconductor chip.

This solution is particularly suitable for the processing of so-called matrix substrates with which the substrate sites for the semiconductor chips are arranged next to each other on the substrate in blocks of n rows and m columns. Mounting of the semiconductor chips takes place as usual in three steps: In the first step, adhesive is applied to the substrate sites at a dispensing station. In the second step, the semiconductor chips are placed onto the substrate sites at a bonding station. In the third step, the adhesive is hardened.

In order that sufficient time is available for the hardening of the adhesive, processing of such a matrix substrate takes place in blocks as follows: As soon as a block with its n×m substrate sites is completely equipped with semiconductor chips, the vacuum is released and the substrate is advanced in transport direction. At the same time, the support plate and heating plate are moved back in the opposite direction to the transport direction to a predetermined start position. Afterwards, vacuum is applied to the channels of the support plate as well as the heating plate so that the substrate lies flat and is fixed on the support plate and also on the heating plate. Subsequently, adhesive is applied to the next n×m substrate sites at the dispensing station and, at the bonding station, the substrate sites to which adhesive has already been applied are equipped column for column with semiconductor chips. When a column is fully equipped, then, without releasing the vacuum, the support plate and the heating plate are advanced together in transport direction for equipping the next column. The substrate therefore remains fixed on the support plate and the heating plate and is moved with them. After equipping the last column of a block, the next cycle begins in the way described by releasing the vacuum, advancing the substrate and returning the support plate and the heating plate.

Doubling or triplicating of the curing time can be achieved in that the heating plate is formed with two or three heating positions. In order that the throughput rate of the automatic assembly machine can be maintained relatively high, relatively fast setting adhesives must be used with this solution.

With certain applications, it suffices when the adhesive is only partially cured, eg., 80%. The remaining hardening then takes place in a subsequent process step, for example, during wiring on a wire bonder.

With a second solution, the hardening of the adhesive does not take place on the automatic assembly machine, but in an oven. During the time spent in the oven, it is ensured that the substrate lies flat on a support. A plate with channels or grooves to which vacuum can be applied so that the substrate can be sucked on to it serves as the support. The plate itself can, but must not necessarily, be heated. With this solution, slowly setting adhesives can also be used.

The invention results in a great improvement in the mounting quality. Because the substrate is held flat during hardening of the adhesive, an adhesive layer of constant thickness is formed between the substrate and the semiconductor chip: During hardening, the adhesive can no longer bend the substrate. Furthermore, a greater homogeneity of the adhesive is achieved while the customary hardening, the different components of the adhesive can segregate, for example, into areas of a lot of silver and areas with little silver, or even voids can occur.

Furthermore, the lying flat of the substrate on the heating plate guarantees the reliable heat transfer from the heating plate to the adhesive. This is of great importance as the quality of the heat transfer has a decisive influence on the curing time necessary for the complete hardening of the adhesive.

In the following, embodiments of the invention are explained in more detail based on the drawing.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a method and apparatus for mounting semiconductor chips onto a flexible substrate. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
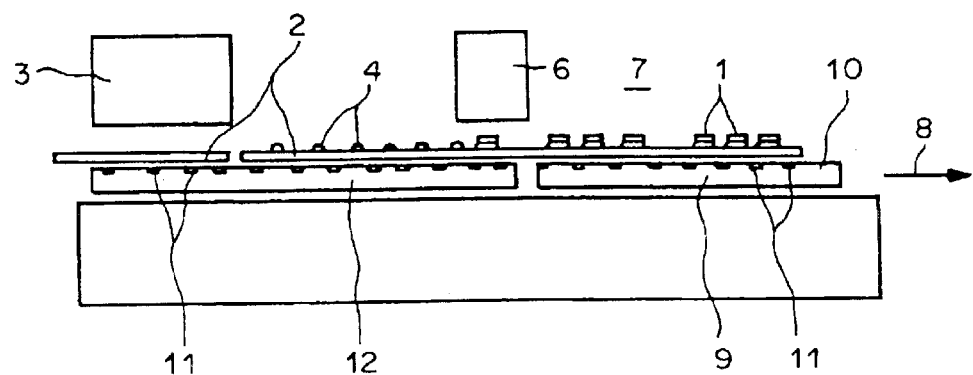
FIG. 1 is a diagram schematically illustrating a device for the mounting of semiconductor chips in accordance with an embodiment of the present invention.

FIG. 1 shows a schematic presentation of a device for the mounting of semiconductor chips 1 onto a flexible substrate 2 in accordance with an embodiment of the present invention. The device has a dispensing station 3 for applying adhesive 4 to substrate sites 5 (FIG. 3) of the substrate 2, a bonding station 6 for equipping the substrate sites 5 with the semiconductor chips 1 and a curing station 7 for hardening the adhesive 4 which are arranged one after the other in transport direction 8 of the substrate 2. The curing station 7 comprises a movable heating plate 9 the support surface 10 of which facing the substrate 2 has channels 11 to which vacuum can be applied for sucking down the substrate 2. Furthermore, the mounting device comprises a support plate 12, movable together with the heating plate 9, which also has channels 11 to which vacuum can be applied for sucking down the substrate 2. Two drives are provided for moving the heating plate 9 and the support plate 12 in transport direction 8 as well as in a direction 13 (FIG. 2) at right angles to the transport direction 8.

Figure 2:
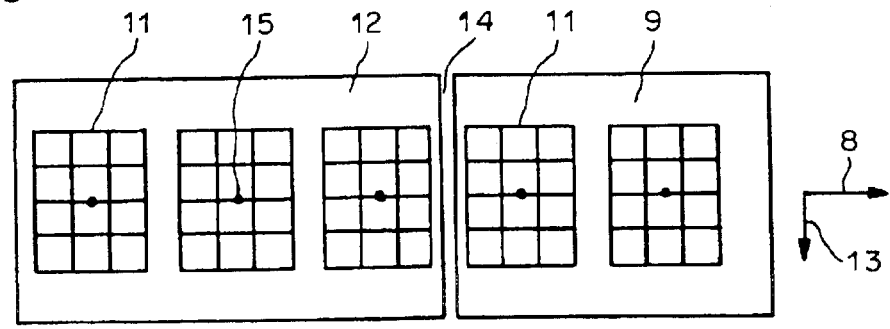
FIG. 2 is a diagram schematically illustrating a plan view of a support plate and a heating plate in accordance with an embodiment of the present invention.

FIG. 2 shows a plan view of the support plate 12 and the heating plate 9. Mechanically, the support plate 12 and the heating plate 9 are rigidly connected but are separated by means of a gap 14. In this way, it is avoided that significant heat is transferred from the heating plate 9 to the support plate 12 so that hardening of the adhesive 4 only begins when the substrate sites 5 are located on the heating plate 9.

The channels 11 are connected to a vacuum source via drill holes 15. Position and length of the individual channels 11 are selected so that the substrate 2 can be sucked down over its whole area so that it rests absolutely flat on the support plate 12 or the heating plate 9. The heating plate 9 has two fields with channels 11 so that the adhesive 4 can be cured over two cycles.

Figure 3:
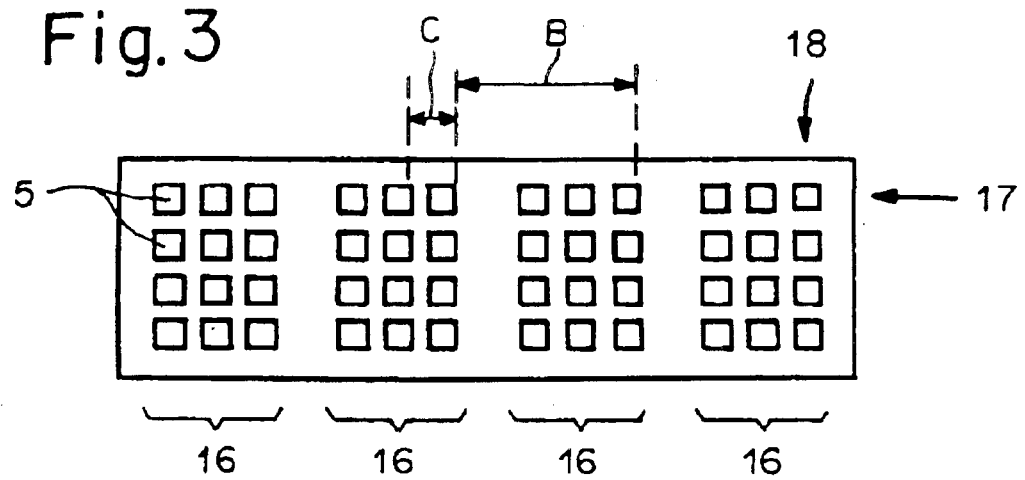
FIG. 3 is a diagram schematically illustrating a plan view of a substrate in accordance with an embodiment of the present invention.

FIG. 3 shows a plan view of the substrate 2. The substrate sites 5 are arranged in blocks 16 of m rows 17 and n columns 18. In the example shown, m=3 and n=4. The distance from column 18 to column 18 is marked with C, the distance from block 16 to block 16 with B.

In operation of the mounting device, the substrate sites 5 are processed in blocks: At the dispensing station 3, the adhesive 4 is applied to the substrate sites 5 of a first block 16. At the bonding station 6, the semiconductor chips 1 are placed onto the substrate sites 5 of a second block 16. In the curing station 7, the hardening of the adhesive 4 takes place for the substrate sites 5 of a third and fourth block 16.

Depending on the instantaneous situation, the four blocks 16 belong to the same substrate 2 or to different substrates 2. The processing by blocks means that, during processing of the m×n substrate sites 5 of a block 16, the substrate 2 remains continuously fixed to the support plate 12 and the heating plate 9. Only when a block 16 with its m×n substrate sites 5 is completely equipped with semiconductor chips 1 is the vacuum released and the substrate 2 advanced in transport direction 8 by the distance B−(n−1)×C. At the same time, the support plate 12 and the heating plate 9 are moved back by a distance (n−1)×C against transport direction 8 to a predetermined start position. After this, vacuum is applied to the channels 11 of the support plate 12 as well as to those of the heating plate 9 so that the substrate 2 rests flat on and is fixed to the support plate 12 and the heating plate 9. Subsequently, adhesive 4 is applied to the substrate sites 5 of the next block 16 at the dispensing station 3 and, at the bonding station 6, semiconductor chips 1 are applied column 18 for column 18 to the substrate sites 5 which already have adhesive 4. When a column 18 is fully equipped, without releasing the vacuum, the support plate 12 and the heating plate 9 are advanced together in transport direction 8 by distance C for equipping the next column 18. In doing so, the substrate 2 remains fixed to the support plate 12 and the heating plate 9 and is moved with them. After equipping the last column 18 of a block 16, the next cycle begins in the way described by releasing the vacuum, advancing the substrate 2 by the distance B−(n−1)×C and returning the support plate 12 and the heating plate 9 by the distance (n−1)×C.

If the bonding station 6 always places the semiconductor chips 1 at a predetermined location, the support plate 12 and the heating plate 9 are also moved in direction 13, i.e., orthogonal to the transport direction 8, for equipping the m substrate sites 5 lying within a column 18.

Figure 4:
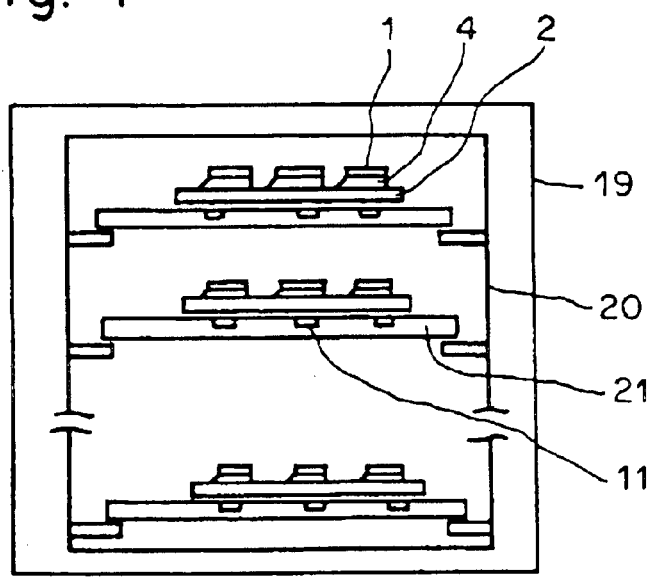
FIG. 4 is a diagram schematically illustrating a cross-sectional view of an oven in accordance with an embodiment of the present invention.

FIG. 4 shows a cross-section of an oven 19 for the curing of the adhesive 4. The oven 19 has a removable magazine 20 with numerous plates 21 which have channels 11 to which vacuum can be applied in order to suck down the substrate 2. The magazine 20 is loaded with the substrates 2 in a relatively cold condition outside the oven 9 and vacuum is applied to the channels 11 of its plates 21 so that the substrates 2 rest flat on the plates 21 before hardening starts.

Figure 5:
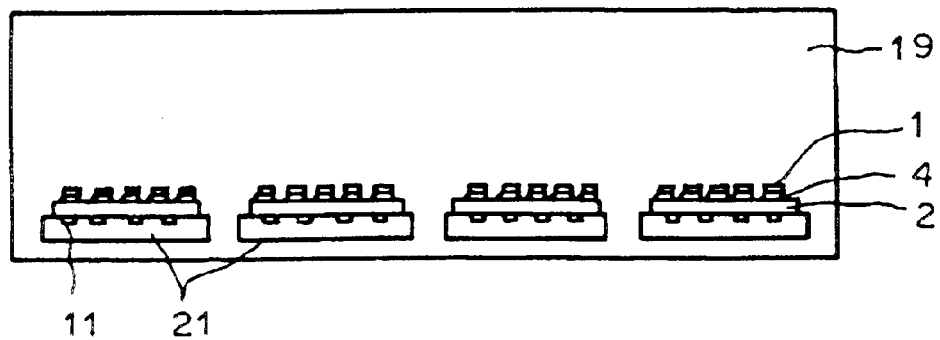
FIG. 5 is a diagram schematically illustrating a cross-sectional view of an oven in accordance with another embodiment of the present invention.

FIG. 5 shows a cross-section of a further oven 19 which is formed as a continuous oven. The substrates 2 equipped with the semiconductor chips 1 are transported one after the other through the oven 19 in feed-through direction. The substrates 2 rest on plates 21 which have channels 11 to which vacuum can be applied in order to suck down the substrates 2 so that they rest flat on the plates 12.

While embodiments and applications of this invention have been shown and described, it would be apparent to those skilled in the art having the benefit of this disclosure that many more modifications than mentioned above are possible without department from the inventive concepts herein. The invention, therefore, is not to be restricted except in the spirit of the appended claims.

What is claimed is:

1. A method for mounting semiconductor chips onto a flexible substrate, whereby flexible substrates are transported along a transport direction passing a dispensing station where adhesive is applied to predetermined substrate sites on the flexible substrate and then passing a bonding station where the semiconductor chips are placed on the substrate sites, the method further comprising having the flexible substrate fixed to a heating plate by means of vacuum during curing of the adhesive, wherein the heating plate is rigidly connected to a support plate which serves for fixing the flexible substrate during application of adhesive and during placing of the semiconductor chip and wherein the substrate sites are processed in blocks by;

transporting the flexible substrate in the transport direction and fixing the flexible substrate by means of vacuum;

repeatedly moving the support plate and the heating plate to a predetermined number of positions, wherein at each said position adhesive is applied to a substrate site at the dispensing station and a semiconductor chip is placed on another substrate site at the bonding station;

releasing the vacuum; and transporting the flexible substrate in the transport direction and simultaneously moving the support plate and the heating plate in a direction opposite to the transport direction.

2. A method according to claim 1, wherein the support plate and the heating plate are separated by a gap.

3. A method for mounting semiconductor chips onto a flexible substrate, comprising:

transporting the flexible substrate along a first path first to a dispensing station;

dispensing (at the dispensing station) adhesive to predetermined substrate sites of the flexible substrate;

transporting the flexible substrate along a second path next to a bonding station;

placing semiconductor chips (at the bonding station) onto the predetermined substrate sites of the flexible substrate;

transporting the flexible substrate along a third path next to a heating station;

urging (at the heating station) the flexible substrate against a heated heating plate with a vacuum while the adhesive at least partially cures, the heating plate being rigidly connected to a support plate which provides support for the flexible substrate during said dispensing and said placing.

4. The method of claim 3, further comprising:

repeatedly moving the heating plate and support plate during placement of the semiconductor chips in said transport direction and a direction at right angles to said transport direction;

releasing the vacuum;

transporting the flexible substrate in said transport direction; and transporting the support plate and the heating plate in a direction other than said transport direction.

5. The method of claim 4, where said direction other than said transport direction is a direction opposite said transport direction.

6. The method of claim 5, wherein the support plate and the heating plate are separated by a gap.

7. A method for mounting semiconductor chips onto a flexible substrate, comprising:

transporting the flexible substrate along a first path to a dispensing station;

dispensing adhesive to predetermined substrate sites of the flexible substrate;

transporting the flexible substrate along a second path to a bonding station;

placing semiconductor chips onto the predetermined substrate sites of the flexible substrate;

transporting the flexible substrate along a third path to a heating station;

urging the flexible substrate against a heated heating plate with a vacuum applied between the flexible substrate and the heating plate while the adhesive at least partially cures;

wherein the heating plate is rigidly connected to a support plate which also provides support for the flexible substrate during said dispensing and said placing.

8. The method of claim 7, comprising:

repeatedly moving the heating plate and support plate during placement of the semiconductor chips in said transport direction and a direction at right angles to said transport direction;

discontinuing said urging;

transporting the flexible substrate in said transport end direction;

transporting the support plate and the heating plate in a direction other than said transport direction.

9. The method of claim 8, wherein said direction other than said transport direction is a direction opposite said transport direction.

10. The method of claim 8, wherein the support plate and the heating plate are separated by a gap.

11. A method for mounting semiconductor chips onto a flexible substrate, comprising:

transporting the flexible substrate along a first path in a transport direction to a dispensing station;

dispensing adhesive to predetermined substrate sites of the flexible substrate from the dispensing station;

transporting the flexible substrate along a second path in the transport direction to a bonding station;

placing semiconductor chips onto the predetermined substrate sites of the flexible substrate from the bonding station;

transporting the flexible substrate along a third path in the transport direction to a heating station;

urging the flexible substrate against a heated heating plate with a vacuum applied between the flexible substrate and the heating plate while the adhesive at least partially cures;

wherein the heating plate is rigidly connected to a support plate which also provides support for the flexible substrate during said dispensing and said placing.

12. The method of claim 11, further comprising:

repeatedly moving the heating plate and support plate during placement of the semiconductor chips in said transport direction and a direction at right angles to said transport direction:

discontinuing said urging;

transporting the flexible substrate in said transport direction; and transporting the support plate and the heating plate in a direction other than said transport direction.

13. The method of claim 12, wherein said direction other than said transport direction is a direction opposite said transport direction.

14. The method of claim 13, wherein the support plate and the heating plate are separated by a gap.

15. A method for mounting semiconductor chips onto a flexible substrate, comprising:

transporting the flexible substrate along a first path in a transport direction to a dispensing station;

dispensing adhesive to predetermined ones of a block of n rows and m columns of substrate sites of the flexible substrate from the dispensing station;

transporting the flexible substrate along a second path in the transport direction to a bonding station;

placing semiconductor chips onto the predetermined substrate sites of the flexible substrate from the bonding station;

transporting the flexible substrate along a third path in the transport direction to a heating station;

urging the flexible substrate against a heated heating plate with a vacuum applied between the flexible substrate and the heating plate while the adhesive at least partially cures; and supporting the flexible substrate with a support plate which moves with and is thermally decoupled from said heating plate during said dispensing and said placing.

16. The method of claim 15, further comprising:

urging the flexible substrate against the support plate with a vacuum disposed between the support plate and the flexible substrate during said dispensing.

17. The method of claim 15, further comprising:

urging the flexible substrate against the support plate with a vacuum disposed between the support plate and the flexible substrate during said placing.

18. The method of claim 15, further comprising:

urging the flexible substrate against the support plate with a vacuum disposed between the support plate and the flexible substrate during said dispensing and said placing.

19. The method of claim 15, further comprising:

repeatedly moving the heating plate and support plate during placement of the semiconductor chips in said transport direction and a direction at right angles to said transport direction;

discontinuing said urging;

transporting the flexible substrate in said transport direction; and transporting the support plate and the heating plate in a direction other than said transport direction.

20. The method of claim 17, wherein the support plate and the heating plate are thermally decoupled by means of a gap disposed between them.

* * * * *